United States Patent [19]
Wills et al.

[11] Patent Number: 5,149,675
[45] Date of Patent: Sep. 22, 1992

[54] RING CRYSTALLIZATION OF WAFERS TO PREVENT THERMAL SHOCK

[75] Inventors: Kendall S. Wills, Houston; Paul A. Rodriguez, Lewisville; Melvin L. Brewer, Plano, all of Tex.

[73] Assignee: Texas Instruments Incorporated, Dallas, Tex.

[21] Appl. No.: 636,314

[22] Filed: Dec. 31, 1990

[51] Int. Cl.⁵ .............................................. C30B 33/00
[52] U.S. Cl. ................................... 437/248; 437/174; 437/939
[58] Field of Search ...................... 437/174, 248, 939; 148/DIG. 71, DIG. 90; 156/603

[56] References Cited

U.S. PATENT DOCUMENTS 4,751,193  6/1988  Myrick .................................. 437/19

FOREIGN PATENT DOCUMENTS 207642  12/1983  Japan ................................... 437/939
2049232  2/1990  Japan ................................... 156/603

OTHER PUBLICATIONS

Wolf et al., Silicon Processing for the VLSI ERA p. 56-58 (Lattice Press. 1986).

Primary Examiner—Olik Chaudhuri
Assistant Examiner—Ken Horton
Attorney, Agent, or Firm—Ronald O. Neerings; Lawrence J. Bassuk; Richard L. Donaldson

[57] ABSTRACT

A ring of polycrystalline material is developed around the edge of a wafer by general heating of the wafer and localized heating with a laser beam followed by rapid cooling. The ring of polycrystalline material helps prevent wafer breakage due to thermal shock. One or more additonal ring, loop or closed figures of polycrystalline material can be formed inside of said ring of polycrystalline material developed around the edge of the wafer to further reinforce the wafer.

6 Claims, 6 Drawing Sheets

RING CRYSTALLIZATION OF WAFERS TO PREVENT THERMAL SHOCK

FIELD OF THE INVENTION

This invention relates to the prevention of wafer breakage due to thermal shock and more particularly to the introduction of concentric rings of damage into a wafer to prevent fracture lines from propagating through the wafer.

BACKGROUND OF THE INVENTION

Wafers built for use in the fabrication of semiconductor devices are inherently brittle. They are cut along a known crystal line and fracture easily when placed into a hot water bath or when pushed into a diffusion furnace.

Various techniques have been utilized in an attempt to counteract the problem of brittleness. In one technique, impurities are allowed to infiltrate the wafer production process to prevent the wafer from becoming too brittle to be useful. In another technique, dopant impurities are intentionally diffused into the wafer to increase flexibility. Yet another technique utilizes laser annealing wherein a laser is scanned along the bottom of the wafer to increase the defect sites on the wafer. The defect sites act as traps to getter unwanted impurities in the wafer. The damage, however, does nothing to reduce the brittleness.

What is needed is a process which will allow the wafer to withstand the rigors of the device fabrication process without the drawbacks of additional dopant impurities and defect sites which are inherent in the previously mentioned techniques.

SUMMARY OF THE INVENTION

It is the principal object of this invention to introduce concentric rings of damage into a wafer to prevent propagation of a fracture line through the wafer. Such damage prevents wafer breakage due to thermal shock when the wafer is dipped into hot water or inserted into a diffusion furnace.

In accordance with one embodiment of the invention, a wafer is controlled and maintained at a level temperature. A ring of polycrystalline material is developed around the edge of the wafer by localized heating with a heat source consisting of, but not limited to a laser beam, focused ion beam, flash lamp, electron beam or combinations of the above said heat sources, followed by rapid cooling. The polycrystalline material around the edge prevents the wafer from breaking due to thermal shock.

In accordance with another embodiment of the invention, the wafer is controlled and maintained at a level temperature. Next, a laser beam locally heats the bottom surface, or surface opposite the device surface, causing a molten pool of material which solidifies into a polycrystalline mass due to rapid cooling after the laser power is removed. The laser beam continues to move around the wafer in either a random or selected pattern until a ring, loop, closed figure or any combination of closed lines or closed figures of recrystallized material is formed.

The depth of a ring of damage developed around the edge of the wafer can vary up to, and include, the device surface. The depth of every other ring, loop, closed figure or any combination of closed lines or closed figures of damage within the wafer can vary up to, but not include, the device surface. The single crystal properties of the device surface must be maintained. Because each ring, loop, closed figure or any combination of closed lines or closed figures of recrystallized material is polycrystalline in nature, fracture lines, which normally cause damage to the wafer, are difficult to start and propogate.

A transparent coating such as SiO2 may be used to further influence the formation of polycrystalline material.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENT

Figure 1:
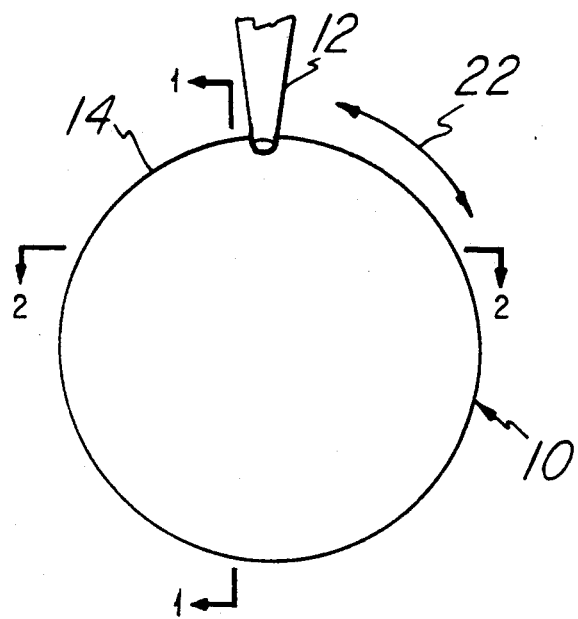
FIG. 1 is a plan view according to one embodiment of the invention.
Figure 2:
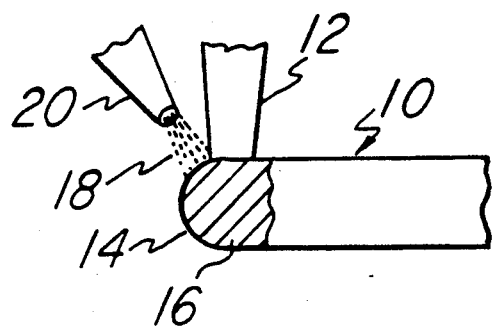
FIG. 2 is an elevational view in section, greatly enhanced, of the device of FIG. 1, taken along the lines 1—1 and 2—2.
Figure 3:
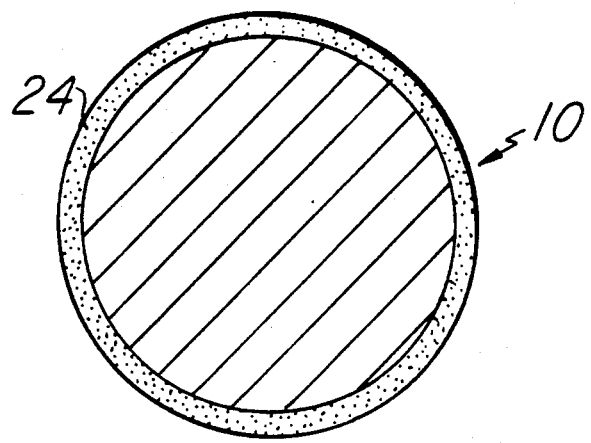
FIG. 3 is a plan view according to the embodiment of FIG. 1.

In FIGS. 1 and 2, a wafer 10 is controlled and maintained at a level temperature between 500–800 degrees celsius. Localized heat 12 from a heating source consisting of, but not limited to a laser beam, focused ion beam, flash lamp, electron beam or multiple of the above said heat sources, heats the edge 14 of wafer 10, causing a molten pool of material 16 followed by rapid cooling 18 from a cooling source 20, to produce polycrystalline material. This process continues with the rotation 22 of wafer 10 and/or localized heat 12 in either a random or non-random pattern until a ring of polycrystalline material 24, shown in FIG. 3, is developed around the edge 14 of wafer 10.

Figure 4:
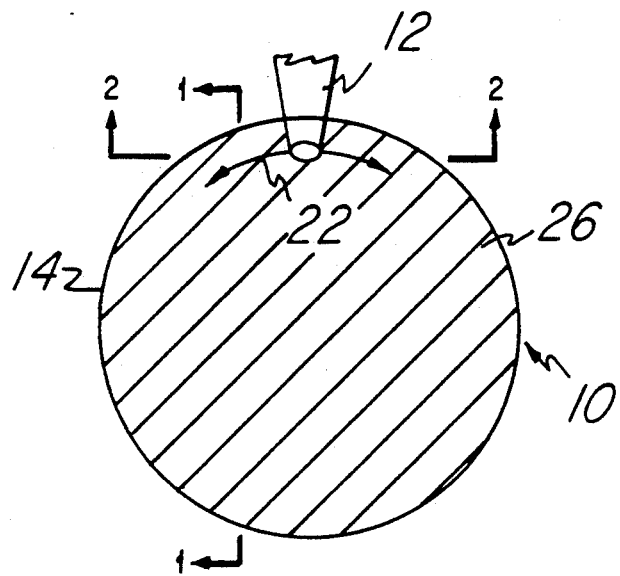
FIG. 4 is a plan view according to another embodiment of the invention.
Figure 5:
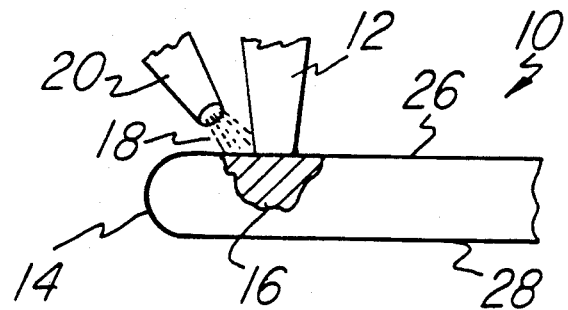
FIG. 5 is an elevational view in section, greatly enhanced, of the device of FIG. 4, taken along the lines 1—1 and 2—2.
Figure 6:
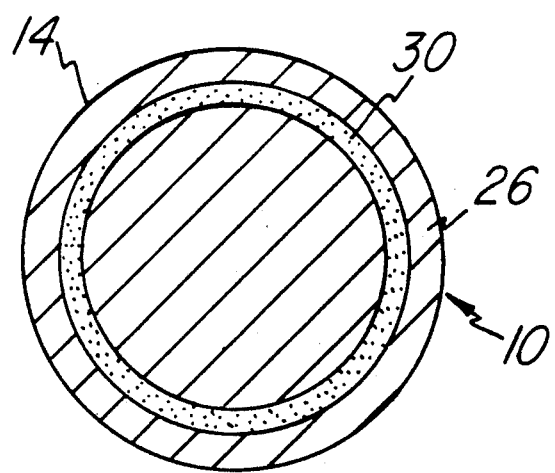
FIG. 6 is a plan view according to the embodiment of FIG. 4.

In another embodiment of the invention, shown in FIGS. 4 and 5, a wafer 10 is controlled and maintained at a level temperature between 500 and 800 degrees celsius. Localized heat 12 from a heat source, consisting of but not limited to a laser beam, focused ion beam, flash lamp or electron beam or any combination of the above, locally heats the bottom surface 26, or surface opposite the device surface 28, causing a molten pool of material 16 up to, but not including the device surface 28, followed by rapid cooling 18 from a cooling source 20, to produce polycrystalline material. This process continues with the rotation 22 of wafer 10 and/or localized heat 12, shown in FIG. 6, in either a random or selected pattern until a ring, loop or closed figure of polycrystalline material 30 is formed.

Figure 7:
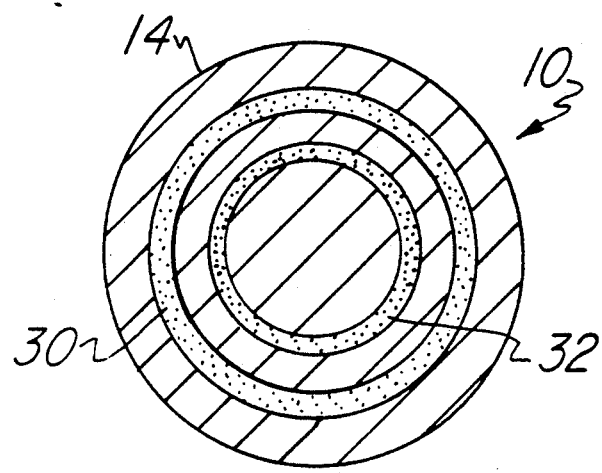
FIG. 7 is a plan view of yet another embodiment of the invention.

In yet another embodiment of the invention, shown in FIG. 7, another ring, loop, or closed figure of polycrystalline material 32 is formed inside of polycrystalline ring, loop or closed FIG. 30, according to the same method.

Figure 8:
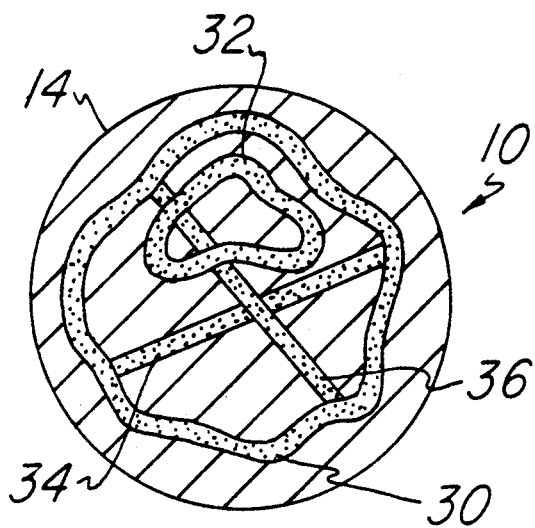
FIG. 8 is a plan view of still another embodiment of the invention.

In still another embodiment of the invention, shown in FIG. 8, loop or closed FIG. 32 is formed inside of ring, loop or closed FIG. 30 and closed lines 34 and 36 criss cross within ring, loop or closed FIG. 32, according to the same method.

Figure 9:
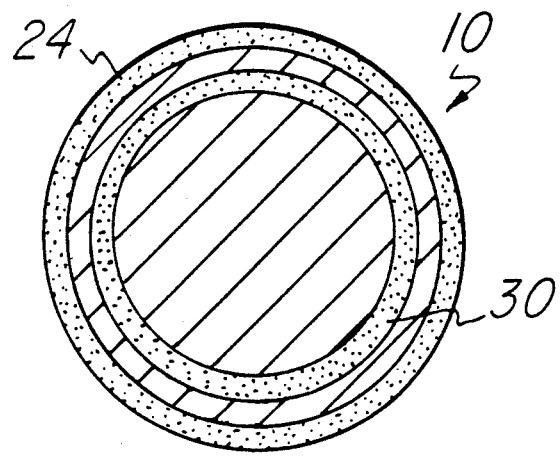
FIG. 9 is a plan view of a further embodiment of the invention.

In still another embodiment of the invention, localized heat 12 heats the edge 14 of wafer 10, causing a molten pool of material 16 followed by rapid cooling 18 from a cooling source 20, to produce polycrystalline material. This process continues with the rotation 22 of wafer 10 and/or localized heat 12 in either a random or selected pattern until a ring of polycrystalline material 24 is developed around the edge 14 of wafer 10. Localized heat 12 next heats the bottom surface 26, or surface opposite the device surface 28, causing a molten pool of material 16 up to, but not including, the device surface 28, followed by rapid cooling 18 from a cooling source 20, to produce polycrystalline material. This process continues with the rotation 22 of wafer 10 and/or localized heat 12 in either a random or selected pattern until a ring, loop or closed figure of polycrystalline material 30 is formed, as shown in FIG. 9.

Figure 10:
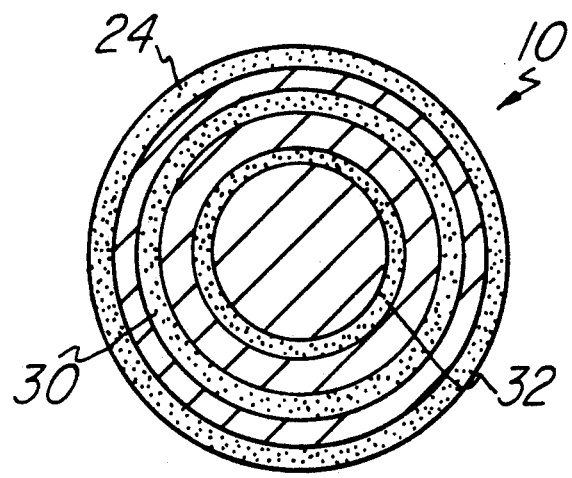
FIG. 10 is a pla., view of still yet another embodiment of the invention.

In yet a further embodiment of the invention shown in FIG. 10, a ring, loop or closed figure of polycrystalline material 32 is formed inside of ring, loop or closed FIG. 30, according to the same method.

Figure 11:
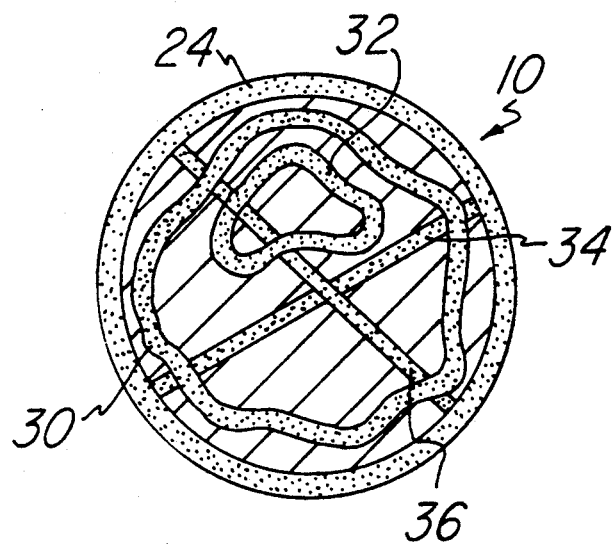
FIG. 11 is a plan view of yet another embodiment of the invention.

In yet still another embodiment of the invention, closed lines 34 and 36 are formed, as shown in FIG. 11, according to the same method.

In yet further embodiments of the invention, not shown, additional rings, loops or closed figures of polycrystalline material are formed between polycrystalline rings, loops, or closed FIGS. 24, 30 and 32 as needed.

Figure 12:
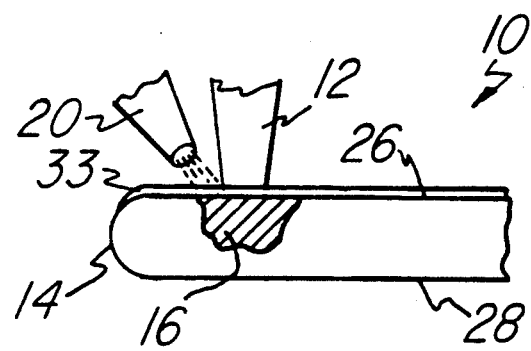
FIG. 12 is an elevational view in section, greatly enhanced, of the device of FIG. 4, greatly enhanced taken along the lines 1—1 and 2—2 according to another embodiment of the invention.

In still yet a further embodiment of the invention, the addition of a cover material 33 promotes the formation of polycrystalline material, as shown in FIG. 12.

What is claimed:

1. A method of preventing breakage of a single crystal wafer due to thermal shock, comprising the steps of:
    controlling and maintaining said wafer at a level temperature;
    heating the edge of the wafer with a localized heating source until a molten pool of material develops, followed immediately by rapid cooling of the molten pool; and
    rotation of said wafer and/or said localized heating source, concurrent with said heating and said rapid cooling, until a ring of polycrystalline material is formed around said edge of said wafer.

2. A method according to claim 1 including at least a second ring, loop or closed figure of polycrystalline material formed inside of said ring of polycrystalline material formed around said edge of said wafer.

3. A method according to claim 1 wherein said level temperature is between 500-800 degrees celsius.

4. A method according to claim 1 wherein said heat from said localized heating source is generated by; a laser beam; focused ion beam; flash lamp; electron beam or combinations of the above.

5. A method according to claim 1 wherein said rotation of said water and/or said localized heating source is in a random pattern.

6. A method according to claim 1 wherein said rotation of said wafer and/or said localized heating source is in a selected pattern.

* * * * *